United States Patent [19]

Enichen

[11] Patent Number: 5,552,611
[45] Date of Patent: Sep. 3, 1996

[54] PSEUDO-RANDOM REGISTRATION MASKS FOR PROJECTION LITHOGRAPHY TOOL

[75] Inventor: William A. Enichen, Poughkeepsie, N.Y.

[73] Assignee: International Business Machines, Armonk, N.Y.

[21] Appl. No.: 466,565

[22] Filed: Jun. 6, 1995

[51] Int. Cl.⁶ .................................................. H01J 37/304
[52] U.S. Cl. ........................................................ 250/491.1
[58] Field of Search .............................. 250/491.1, 492.2, 250/492.3, 398, 548; 356/401

[56] References Cited

U.S. PATENT DOCUMENTS

| | | | |
|---|---|---|---|
| 4,363,271 | 12/1982 | Horst | 101/181 |
| 4,370,554 | 1/1983 | Bohlen et al. | 250/491.1 |
| 4,371,264 | 2/1983 | Lacombat et al. | 356/356 |
| 4,590,382 | 5/1986 | Tabata | 250/491.1 |

FOREIGN PATENT DOCUMENTS

| | | |
|---|---|---|
| 58-50728 | 3/1983 | Japan . |
| 63-220518 | 9/1988 | Japan . |

OTHER PUBLICATIONS

Journal of Vacuum Science Technology, B 11(6) Nov./Dec. 1993, pp. 2175–2178, "Mark Detection for Alignment and Registration in a High–Throughput Projection Electron Lithography Tool", Farrow et al.

Primary Examiner—Jack I. Berman
Assistant Examiner—Kiet T. Nguyen
Attorney, Agent, or Firm—DeLio & Peterson

[57] ABSTRACT

An exposure mask for a particle beam projection system used in the manufacture of semiconductors includes pseudo-random mask alignment marks positioned on the exposure mask that match up with corresponding pseudo-random substrate alignment marks. The substrate alignment marks are made up of three repetitions of the pseudo-random code in the mask alignment marks formed as features on the substrate. The alignment marks act together to produce a backscattered alignment signal with an arbitrarily large capture distance, a single peak on a uniform background that makes it easy to detect the aligned position, a high signal to noise ratio and no false peaks that might lead to misalignment.

16 Claims, 4 Drawing Sheets

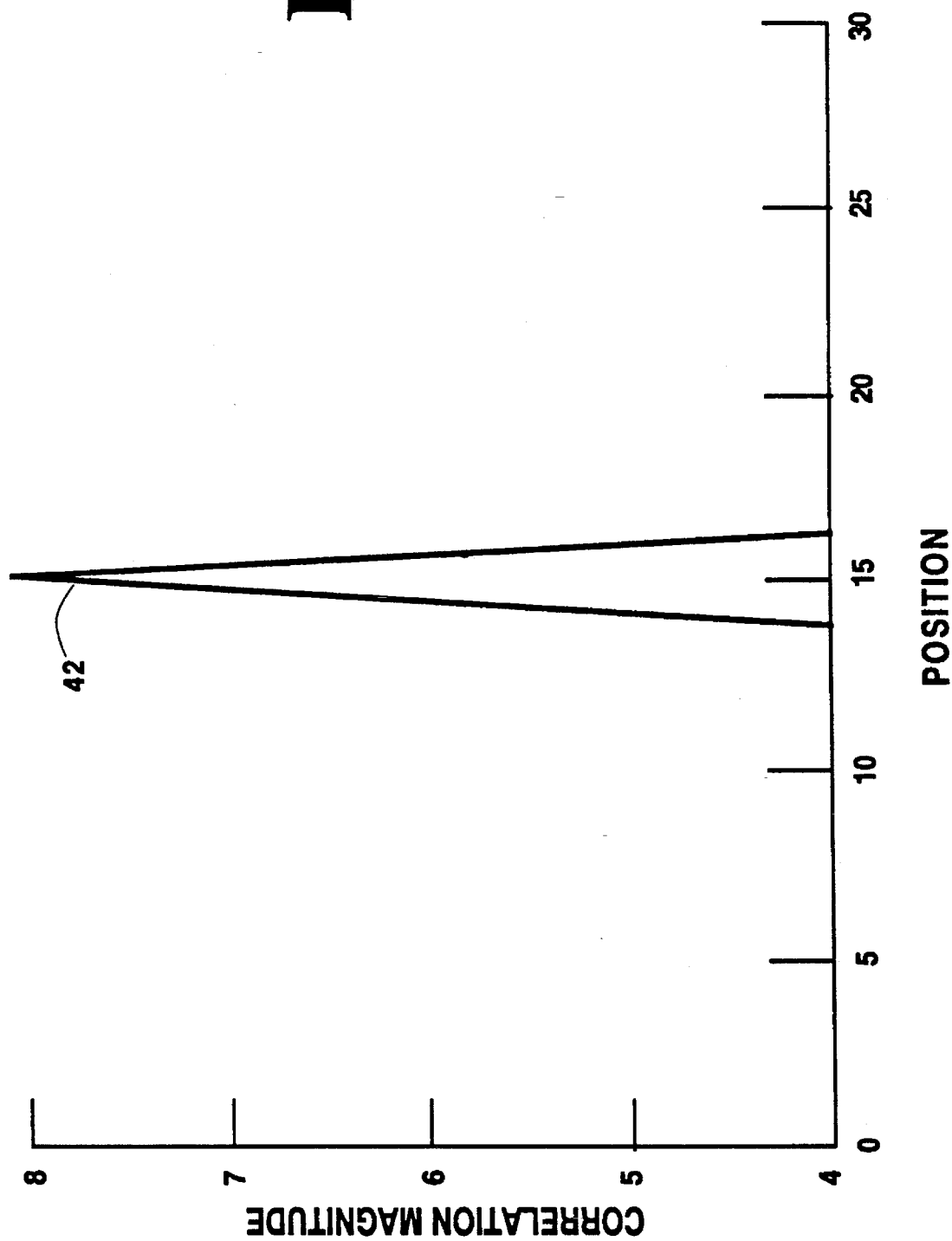

PSEUDO-RANDOM REGISTRATION MASKS FOR PROJECTION LITHOGRAPHY TOOL

BACKGROUND OF THE INVENTION

1. Field of the Invention

This invention relates generally to methods of manufacturing integrated circuits in which particle beam projection systems expose a substrate through a mask. More particularly, the invention relates to an exposure mask having pseudo-random registration marks and the method of aligning a particle beam projection lithography system to achieve rapid and reliable registration of the mask and the substrate prior to exposure of the substrate by a beam of particles.

2. Description of Related Art

The tendency of integrated circuits in semiconductor technology is toward ever-decreasing structure dimensions in order to increase the density of the circuits and their switching speed. Photolithography, which is still used today in the majority of cases, is approaching the limits dictated by the physical resolution of optical systems. Structures having minimum feature sizes of less than 0.25 µm in width cannot be made with optical systems. The most promising methods for the production of such fine structures are particle beam processes. The following specification refers specifically to electron beam systems but the pseudo-random registration mark system described herein can also be applied analogously to other charged particle beam projection systems, such as ion beam systems.

Electron beam systems have a number of advantages: the resolution of the patterns made with them is not limited by diffraction effects; they can be made with high intensity and they are deflectable with relative ease and high precision.

Many electron beam systems operate in accordance with the raster or scanning principle. The electron beam is used as a very fine "pencil" with which the pattern to be exposed is directly written onto a semiconductor substrate coated with an electron beam sensitive layer. The pattern to be produced is provided in the storage of a computer controlling the deflection of the electron beam. The high flexibility of this type of pattern generation, however, involves a high amount of writing time. The throughput of exposed wafers in industrial production is therefore low.

In the production of circuits and circuit chips (chips) having a plurality of repeatedly appearing circuit elements, e.g. memory chips, the flexibility of the raster method is of secondary importance. On the other hand, costs can only be reduced by high chip throughput. Electron beam projection methods utilizing a mask and operating analogously to optical photolithographic methods offer this high throughput since their larger pattern areas are imaged on the substrate by means of the mask through electron radiation. Such systems are known as described in the publications by H. Koops et al., Optik 28, 5, 1968/1969, pp. 518–531; T. W. O'Keeffe, Solid State Electronics, Pergamon Press, 1969, Vol. 12, pp. 841–848; M. B. Heritage, "Electron Projection Micro Fabrication System", Journal of Vacuum Science Technology, Vol. 12, 1975, pp. 1135–1138 and U.S. Pat. No. 4,169,230, U.S. Pat. No. 4,334,156 and U.S. Pat. No. 4,370,554, all assigned to the assignee of the present application.

The problem of increased production of highly integrated monolithic circuits, however, involves not only the possible resolution through the exposure method used but also the precision of the mutual alignment of mask and semiconductor substrate in each exposure step required during a manufacturing process. For achieving good overlapping (so-called "overlay"), registration has to be very precise. Registration is the detection of structures existing on the wafer prior to exposure, and the alignment of the pattern to be imaged (mask) relative to the existing structure.

Patterns for alignment (alignment marks) in electron beam processes are either markings of a material differing from that of the semiconductor substrate, and/or areas of a particular geometric design, e.g. edges. The impinging electron beam backscatters, producing a return signal which can be measured and utilized to determine when the mask is aligned with the substrate.

The quality of the return signal, and, therefore, the reliability and rapidity with which correct alignment can be achieved, is dependent in part upon the physical layout of the alignment marks used in the mask and substrate. One important characteristic is the transmission ratio of the alignment marks used. The ratio in the alignment marks of open areas (allowing the transmission of electrons) to the entire area of the mark affects overall signal level and the resulting signal to noise ratio. A high current density resulting from a high transmission ratio is desirable.

A second important characteristic relates to how easily the correct alignment can be detected. As the alignment marks on the substrate and mask are moved from an initially misaligned position towards an aligned position, the return signal should increase to a maximum level which occurs at perfect registration. As the correct alignment position is passed, the return signal should decrease.

The correlation function of the alignment mark on the mask with the alignment mark on the substrate controls this characteristic. The alignment marks should have a correlation function that produces a relatively large capture distance and a single easily identifiable peak in the return signal. The large capture distance allows the substrate and mask to start with a relatively large initial misalignment. The easily identifiable alignment peak requirement means that there are few or no false peaks that might lead to a false indication of alignment.

One prior art set of alignment marks is a series of evenly spaced parallel bars with the openings between bars having the same width as the bars. Such alignment marks are described in R. C. Farrow, et al., "Marks for Alignment and Registration in Projection Beam Electron Lithography", Journal of Vacuum Science Technology, B 11(6) November/December 1993, pp. 2175–2178. This type of alignment mark has a transmission ratio of 50% which provides a good return signal. However, the repeating bars result in a small capture distance and multiple false peaks in the correlation function that may lead to misalignment.

The distance over which capture occurs properly in the type of alignment system using repeating bars is slightly less than the distance between adjacent bars in the marks. If the substrate and mask are initially misaligned by too much, the opening between two bars in the mask will initially be located over a different opening in the mark on the substrate. As a result, false capture will occur in which the first bar in the mask is positioned over the second bar in the substrate instead of over the corresponding first bar in the substrate and the alignment will be off by the distance between bars in the mark. This problem results from the regular spacing of the bars and spaces in the alignment mark when an opening in the mark on the substrate aligns with a different opening on the mask.

For achieving a high signal to noise ratio the electron beam impinging at the alignment mark should have a high current density. This is relatively easy to achieve in raster processes. In mask exposure, however, the projection methods operate with an expanded electron beam of a relatively low current density. The secondary electrons released by this beam at the conventional alignment marks provide very low registration signals with a high noise factor.

Consequently, when alignment mark patterns are used that have low transmission ratios, it is more difficult to detect the return signal and achieve proper registration. On the other hand, a large capture distance and the absence of false peaks in the correlation function are also important to improving alignment reliability. Prior art alignment systems that have attempted to improve these characteristics of the correlation function have done so by changing the shape of the alignment marks in ways that result in a significant decrease in the transmission ratio.

One possible improvement in the current density and overall signal level consists in the multiple deflection of the beam over the mark with subsequent electronic integration for improving the signal to noise ratio, but this process is time-consuming.

Another suggestion involves switching the electron beam from one exposure mode (with low current density) to a registration mode with high current density (see the article by Heritage). However, the switching of the beam path is difficult to accomplish since the two beam paths cannot always be reproduced.

According to another suggestion (8th International Conference on Electron and Ion Beam Science and Technology, May 1978, page 984, Frosien et al.), switching is abandoned and mechanical diaphragms are pivoted into the beam path instead. However, such mechanical adjustments are not realizable within very short periods.

For automatic as well as manual registration, a method for quickly reaching a registered position should be provided. For this purpose the relative position of the objects at any moment and the direction and shift of the objects to reach the registered position must be known. In German Auslegeschrift 20 46 332, an alignment pattern is described for a photoelectric device, where the spacings between two respective mask openings are not constant. The spacing of the openings corresponds to an arithmetic series. For two-dimensional alignment, two rows of such mask openings arranged vertically to each other are provided. This arrangement has the disadvantage of a low transparency (ratio between the surface of the openings to the overall surface) so that if subjected to electron beam exposure systems the signal to noise ratio would be low. This arrangement also requires two detectors.

U.S. Pat. No. 4,370,554 describes a particle beam lithography system in which the alignment marks are spaced bars similar to the parallel bars described above, but in which the distances between successive bars are set such that no distance can be represented by the sum of smaller distances. This improves the correlation function, but at the expense of decreasing the transmission ratio.

It is therefore the object of the present invention to provide an exposure mask for a particle beam projection system which permits quick, precise and reliable automatic registration of the mask relative to the substrate.

It is another object of the present invention to provide an exposure mask for a particle beam projection system utilizing alignment marks which have a good transmission ratio to provide a good signal to noise ratio.

A further object of the invention is to provide an exposure mask for a particle beam projection system utilizing alignment marks which provide a large capture distance and a single easily identifiable peak in the return signal.

Still other objects and advantages of the invention will in part be obvious and will in part be apparent from the specification.

SUMMARY OF THE INVENTION

The above and other objects, which will be apparent to those skilled in the art, are achieved in the present invention which is directed to an exposure mask for a particle beam projection system. The exposure mask includes at least one mask alignment mark having a plurality of pseudo-randomly arranged openings. Most embodiments, however, will include multiple alignment marks at various corners for global alignment and may include multiple other alignment marks at spaced locations to achieve fine alignment at local positions relative to chip features on the substrate.

In general, the mutual alignment of mask and substrate patterns of a specific semiconductor structure are attained by use of a plurality of individual marks in a specific geometric position with respect to each other. By the pattern of openings in the mask alignment mark, the broad particle beam is split into a multitude of individual beams which interact with alignment marks on the substrate. The interaction is used to generate an alignment signal that is maximum at the aligned position when the openings of the exposure mask are aligned over the corresponding features of the substrate alignment mark. It will be understood that this alignment can be accomplished by moving the mask, moving the substrate or by deflecting particles after they pass through the mask to steer them to desired locations on the substrate.

The openings in the mask alignment mark transmit the particle beam to the substrate which includes at least one corresponding substrate alignment mark. The corresponding substrate alignment mark has features on it which correspond to the openings of the mask alignment mark and which are arranged in the same pseudo-random pattern as the openings of the mask alignment mark. These features interact with the particles in the particle beam that are transmitted through the openings of the mask alignment mark to provide the alignment signal. Preferably, these features will backscatter the charged particles in the charged particle beam (most preferably an electron beam), thereby producing a backscattered alignment signal that can be detected, however other types of features with associated types of detectors could be used to provide and detect the alignment signal.

It should be noted that the term "openings" as used herein in connection with the alignment marks on the mask refers to transparent areas that transmit sufficient particles from the beam through the mask to the substrate. As such, the "openings" may be actual holes of various shapes, or they may comprise thinned areas of an otherwise opaque mask substrate, or regions covered with some other type of particle beam transparent material.

The alignment signal produced is the correlation function of the mask alignment mark with the substrate alignment mark. The openings in the pseudo-random mask alignment mark produce a multiple beam image of that mark. As this multiple beam image is swept across the substrate during alignment, the correlation function is automatically performed. The alignment signal detected as a result of backscattered particles is the sum of all regions of coincidence between the openings in the mask alignment mark and the features in the substrate alignment mark.

Using appropriate pseudo-random codes for the spacing of the openings in the mask alignment mark, the correlation function will include a peak at the aligned position between the substrate and the mask with a magnitude that is greater than any other peak in the correlation function within a distance from the aligned position that is at least twice the width of the peak at the aligned position.

The correlation function of the mask alignment mark with the corresponding substrate alignment mark will preferably include a peak at the aligned position superimposed on a uniform background at the not aligned positions for a capture distance from the aligned position. With pseudo-random codes of appropriate length, the capture distance in the alignment signal is very large, and the peak stands out above the uniform background signal allowing improved alignment over prior art methods. Preferably, the capture distance is at least twice the width of the peak at the aligned position, and the length of the pseudo-random code can be selected to provide greater capture distances of any desired distance.

In the preferred embodiment, the openings in the mask alignment mark are rectilinear and the mask alignment mark comprises a regularly spaced linear array of positions at which the openings may be located, the distance between each of the regularly spaced positions and the adjacent regularly spaced position being approximately the same as the width of the narrowest opening. This allows the alignment mark to be described as a pseudo-random digital code where a one signifies an opening and a zero signifies the absence of an opening.

Exposure masks according to this invention preferably have a transmission ratio of at least fifty percent. In the most highly preferred embodiment, if the length of the pseudo-random digital code is n (corresponding to the number of regularly spaced positions at which openings may appear), the transmission ratio will be (n+1)/2n.

The preferred embodiment has a single repeat of the pseudo-random digital code, i.e., a single repeat of the pattern of openings forming the mask alignment mark while the substrate alignment mark includes at least three repetitions of the pseudo-random digital code in its features.

The invention further includes the method of aligning an exposure mask of the type described above with the substrate in an electron beam projection system. The method includes:

providing a mask alignment mark on the exposure mask, the mask alignment mark including a plurality of openings for transmitting electrons, the openings being arranged pseudo-randomly;

providing a substrate alignment mark on the substrate corresponding to the mask alignment mark, the substrate alignment mark having features that directly correspond to the openings in the mask alignment mark for providing an alignment signal, the substrate alignment mark including at least one repetition of the pseudo-random mask alignment mark;

projecting the exposure mask onto the substrate by transmitting electrons through the exposure mask; and aligning the exposure mask with the substrate by detecting a peak in the alignment signal when the exposure mask is aligned with the substrate such that the electrons transmitted through the openings of the mask alignment mark impinge upon the corresponding features of the substrate alignment mark.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 4 is a graph illustrating the correlation function of the mask alignment mark with the substrate alignment mark of FIG. 3 as used in the present invention.

DESCRIPTION OF THE PREFERRED EMBODIMENT(S)

In describing the preferred embodiment of the present invention, reference will be made herein to FIGS. 1–5.

Figure 1:
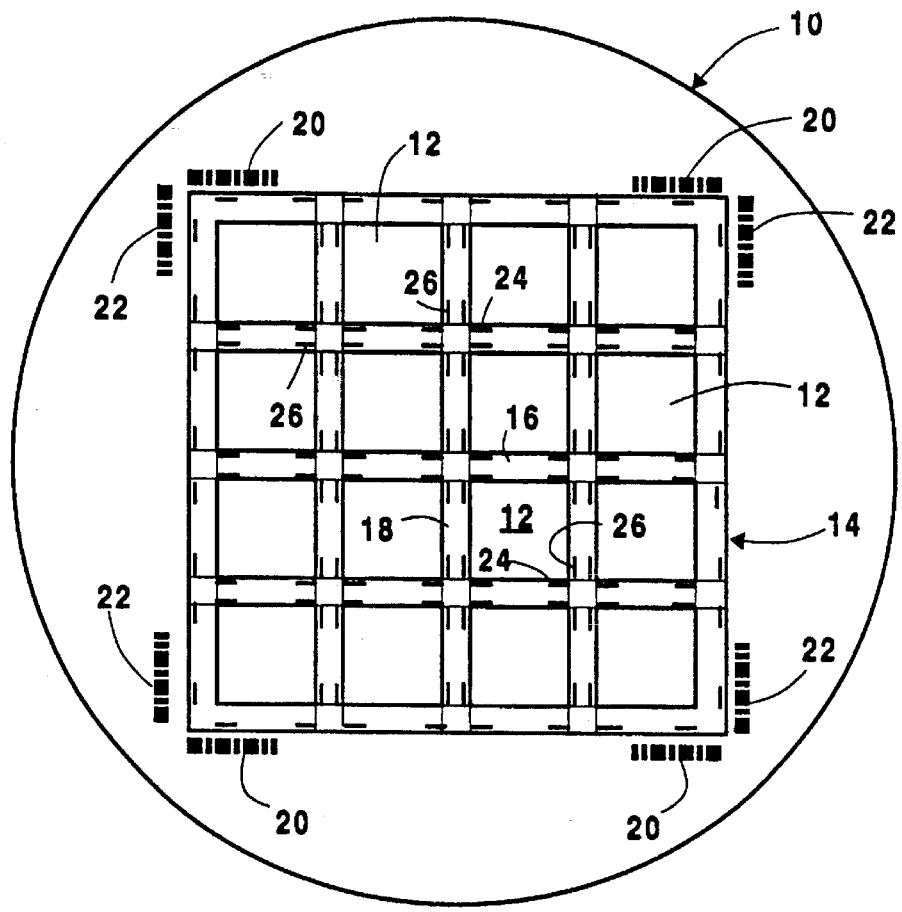
FIG. 1 is a top plan view, not to scale, showing a substrate with global substrate alignment marks according to the present invention at the corners of the chip area and local substrate alignment marks in the kerfs between individual chips.

FIG. 1 shows a substrate 10 including an array of sixteen individual chips 12 located within the large square central chip area 14 in the center of the substrate. Individual chips 12 are separated by horizontal and vertical kerfs 16, 18 defining the cuts used to divide the chips 12 from each other after manufacture. FIG. 1 includes only sixteen individual chips 12, although more or less chips may be manufactured in different embodiments.

At the four corners of the chip area 14, are located global substrate alignment marks 20, 22. Horizontal alignment marks 20 are substantially identical to vertical alignment marks 22 except for a rotation by 90° degrees. One possible pseudo-random horizontal substrate alignment mark 20 is shown at a significantly increased size in FIG. 3. Substantially identical global substrate alignment marks 20, 22 are found at each of the four corners of the chip area 14, although fewer (or more) global alignment marks may also be used.

In addition to the global substrate alignment marks 20, 22, each individual chip 12 in the chip area 14 is provided with local substrate alignment marks at its four corners. Horizontal local substrate alignment mark 24 and vertical local substrate alignment mark 26 are identical to the global substrate alignment marks 20, 22 except for size. However, different pseudo-random codes can be used if desired. When the substrate 10 is diced to produce individual chips, these local alignment marks will be removed as the saw passes through the kerfs 16, 18.

Figure 2:
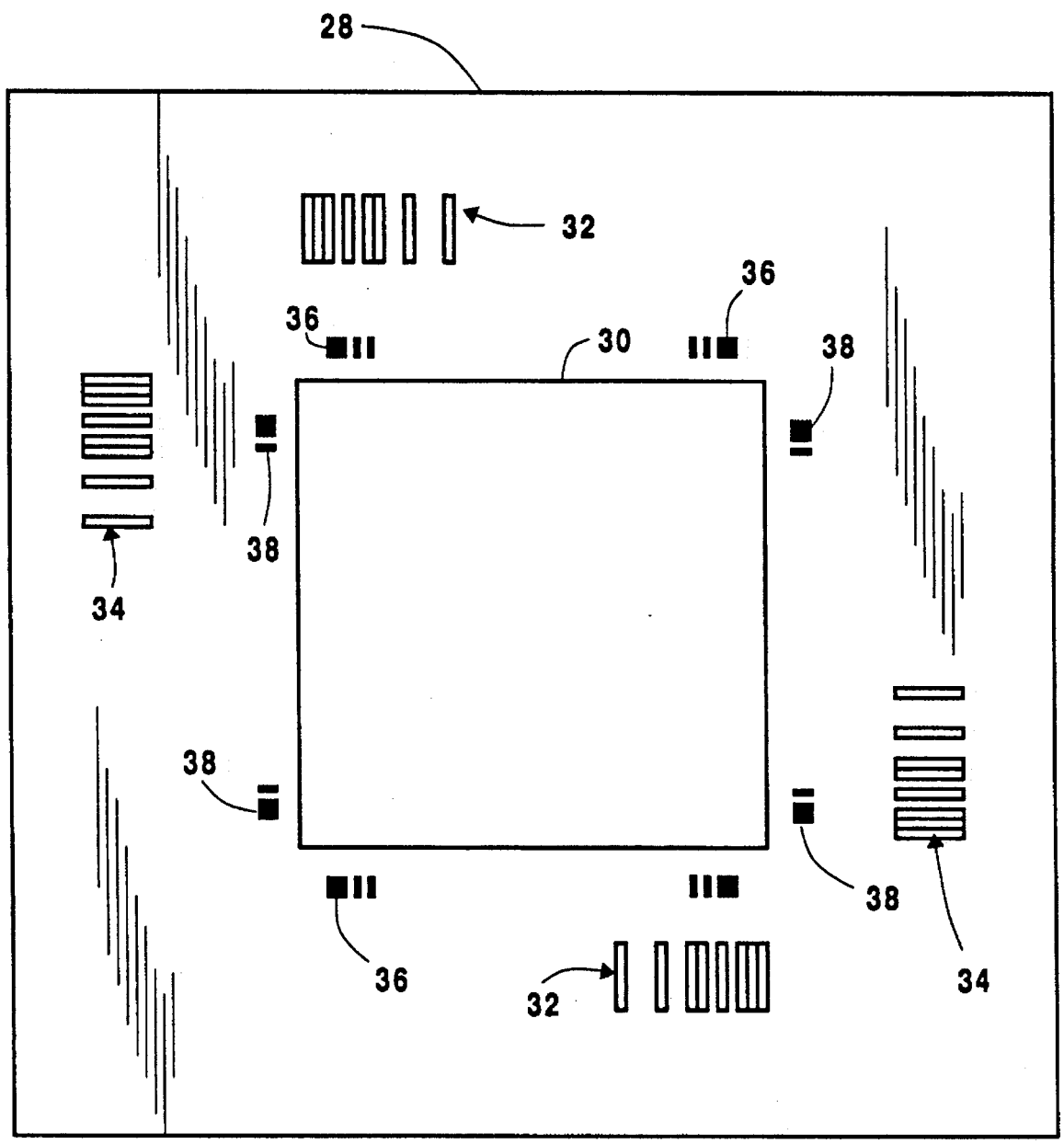
FIG. 2 is a top plan view showing an exposure mask according to the present invention, drawn at a larger size than FIG. 1, with both global and local pseudo-random mask alignment marks.

FIG. 2 illustrates an exposure mask 28 having a chip region 30. FIG. 2 is drawn in an enlarged size relative to FIG. 1 to provide greater detail. Chip region 30 in the center of the exposure mask 28 corresponds to the individual chip regions 12 on substrate 10. Generally chip region 30 will be provided with openings necessary to produce desired circuit features within the chips 12. In a typical projection system operating at a 4× to 5× reduction, the physical dimensions of the mask will be larger by the same 4× to 5× factor than the corresponding features on the substrate.

For alignment with the substrate the exposure mask 28 is provided with global mask alignment marks 32, 34 which correspond respectively to the global substrate alignment marks 20, 22. Only two of the four corners of the mask are provided with global mask alignment marks 32, 34 in the illustrated embodiment, however, additional marks can be added to allow alignment and registration with any of the global marks on the substrate illustrated in FIG. 1.

Figure 3:
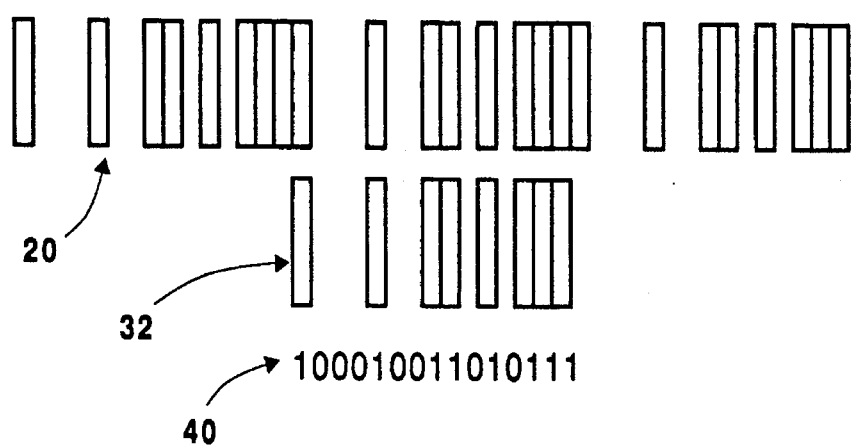
FIG. 3 is drawn at a larger size than FIG. 2 and illustrates one possible mask alignment mark according to the present invention. Also shown is a corresponding substrate alignment mark comprising three repetitions of the pseudo-random code in the illustrated mask alignment mark and a digital representation of the pseudo-random code in the mask alignment mark.

Horizontal global mask alignment mark 32 is shown at an increased size in FIG. 3. It can also be seen in FIG. 3 that the substrate alignment mark 20 comprises three (3) repetitions of the mask alignment mark 32.

Referring back to FIG. 2, it can be seen that the mask 28 is also provided with local mask alignment marks 36, 38 at the four corners of the chip region 30. These local mask alignment marks are preferably identical to global mask alignment marks 32, 34 except for size and position. When the chip area 30 on the mask 28 is perfectly aligned with one of the corresponding chip areas 12 on the substrate 10, the horizontal local mask alignment mark 36 will be directly positioned over the center pseudo-random code of the three (3) repetitions in the corresponding horizontal local substrate alignment mark 24. Similarly, the vertical local mask alignment mark 38 will be perfectly aligned with the center pseudo-random code of the three (3) repetitions in the corresponding vertical local substrate alignment mark 26.

Alignment of the mask with each chip to be exposed on the substrate can be done in this way on a local chip-by-chip basis. Alternatively, global alignment may be done on the basis of global marks to achieve an initial registered position after which translation of known distances between chips may be sufficiently accurate to avoid further fine local registration adjustments. The mask may also be constructed with multiple chip areas corresponding to the multiple chip areas on the substrate allowing a single alignment on a global basis to be undertaken to complete the alignment procedure.

The alignment marks 32, 34, 36, 38 seen in FIG. 2 comprise a sequence of rectilinear openings in the mask which transmit particles in the exposure system to the substrate 10. The openings are laid out in a pseudo-random code providing particularly advantageous characteristics for obtaining proper alignment.

The substrate alignment marks 20, 22, 24, 26 are provided with identically shaped rectilinear features (in three repetitions) whose positions correspond directly to the location of the openings in the mask alignment marks 32, 34, 36, 38. A "feature" may be made of a high atomic number material such as gold or tungsten or it could be formed in the substrate as an etched or raised mark. Any form may be used to provide the alignment signal of backscattered electrons. These electrons are detected to determine when the mask is in correct alignment with the substrate.

As the openings in the alignment mark on the mask come into registration with the features in the alignment mark on the substrate, the alignment signal increases in strength as the number of backscattered electrons increases.

FIG. 3 illustrates one possible pseudo-random mask alignment mark 32 in accordance with the present invention. It can also be seen here that the substrate alignment mark 20 illustrated is simply three (3) repetitions of the complete mask alignment mark 32. A digital code 40 illustrates the correspondence between the pseudo-random digital code 100010011010111 in which a 1 corresponds to an opening in the mask alignment mark (or a feature in the substrate alignment mark) and a zero corresponds to the absence of an opening (or the absence of a feature) in the mask (or substrate) alignment mark.

The pseudo-random codes used to produce the alignment marks of the present invention produce an alignment signal which has improved characteristics relative to prior art alignment marks and their corresponding alignment signals. More specifically, the pseudo-random code 40 producing the alignment marks 32 and 20 results in the correlation function shown in FIG. 4 which comprises a Kronecker delta function on a uniform background. This correlation function corresponds to the alignment signal which is determined by the number of back scattered electrons resulting from electrons that pass through the openings in the substrate mask and impact a feature in the substrate alignment mark.

FIG. 4 indicates on the X-axis the relative position between the mask alignment mark 32 and the substrate alignment mark 20. Position 15 is the point at which the mask alignment mark 32 is directly positioned over the center of the substrate alignment mark 20 as illustrated in FIG. 3. Positions 0 through 14 and 16 through 30 illustrate the uniform background at the value of 4 upon which the peak 42 of the correlation function is superimposed.

The graph of FIG. 4 may be interpreted by noticing that the mask alignment mark 32 in the aligned position shown in FIG. 3 has 8 overlapping openings with 8 corresponding features in the center of the substrate alignment mark 20. This produces the peak magnitude 8 shown at the peak 42 of the correlation function in FIG. 4. However, if the mask alignment mark 32 is moved one position to the left or right, corresponding to positions 14 or 16 in the graph of FIG. 4, the number of correspondences between the openings in the alignment mark 32 and the features in alignment mark 20 drops to four. The number of correspondences remains at four regardless of how far to the left or to the right the mask alignment is shifted relative to the substrate alignment mark 20, provided that the misalignment is not so great that the mask alignment 32 comes into alignment with the first or last of the three (3) repetitions of the pseudo-random code in the substrate alignment mark 20.

FIG. 4 shows two of the valuable characteristics of the pseudo-random code produced alignment signal which makes it easy to detect when proper alignment is achieved. One is the large distance to either side of peak 42 over which the background alignment signal remains constant. This distance is the capture distance. The second advantageous characteristic is the relative height of the peak 42 and the absence of false peaks that might cause a false detection of alignment of the mask relative to the substrate.

Figure 5:
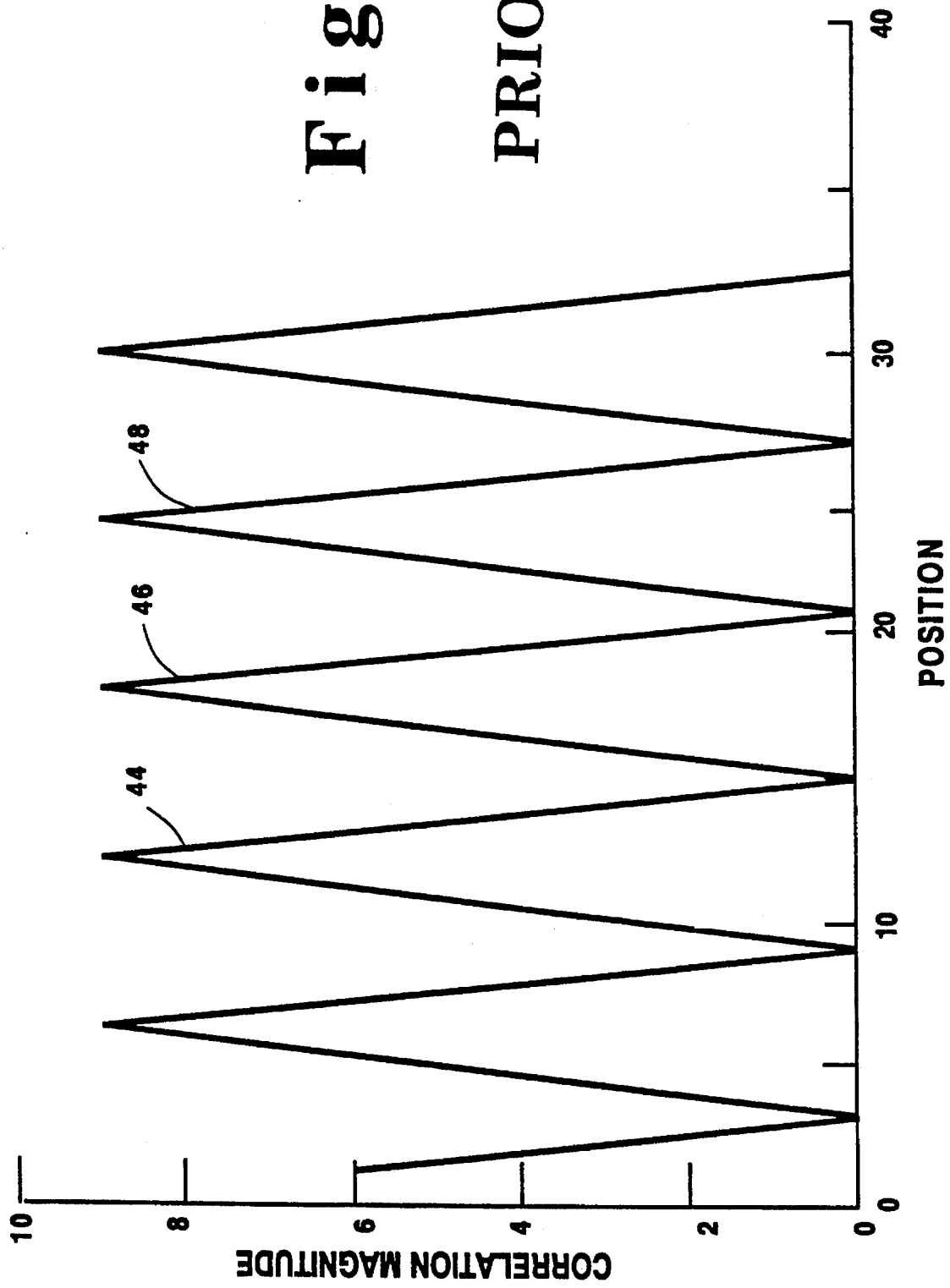
FIG. 5 is a graph illustrating the correlation function of a prior art mask alignment mark comprising uniformly repeating bars with a corresponding substrate alignment mark.

The return signal in FIG. 4 may be compared to the correlation function of a more conventional alignment mark composed of a sequence of uniformly spaced bars as shown in FIG. 5. The correlation function of such a uniform set of bars is the set of repeating identical peaks 44, 46, 48 seen in FIG. 5. Only one of these peaks is the true peak at the aligned position, the remaining being false peaks at misaligned positions. Consequently, with this type of alignment mark the capture distance is slightly less than the line/space period, and the correct aligned position is more difficult to discern.

In contrast, the capture distance of the present invention corresponds to the pattern length. Moreover, different pseudo-random codes can be used with this invention having longer or shorter patterns lengths which increase or decrease the capture distance as desired. It also should be noted that other arrangements of pseudo-random codes may be used with non-rectilinear openings, or arrangements that do not place the openings in a single line.

Another useful property of the pseudo-random codes used in this invention is that they have one more one than they have zeros. For the pseudo-random code 40 shown in FIG. 3, there are eight (8) ones and seven (7) zeros. The scanning pattern thus has a transmission ratio of 8/15 which is slightly greater than 50%, the exposure mask probably has the transmission ratio within the range of 40 to 60 percent. This is highly desirable to give a strong detected signal by transmitting a large proportion of the incident electrons. This relatively high transmission ratio ensures that sufficient electrons will be transmitted and backscattered so that the alignment signal can be detected with a high signal to noise ratio.

For clarity, the openings in FIG. 3 are shown as individual openings even where two openings are immediately adjacent to one another, and would otherwise appear to merge into a single large opening. For example, the last three openings in the digital code 40 are all adjacent to another, and are shown as three individual openings. The adjacent openings, need not be maintained separate from adjacent openings in the code.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An exposure mask for a charged particle beam projection system comprising at least one mask alignment mark positioned on the exposure mask, the mask alignment mark including a plurality of openings, the openings being arranged to pass a charged particle beam to a substrate having at least one corresponding substrate alignment mark, the openings in the mask alignment mark being arranged pseudo-randomly and defining a transmission ratio and a correlation function of the mask alignment mark with the corresponding substrate alignment mark.

2. An exposure mask according to claim 1 wherein the correlation function of the mask alignment mark with the corresponding substrate alignment mark includes a peak at an aligned position having a magnitude greater than any other peak in the correlation function within a distance from the aligned position that is at least twice the width of the peak at the aligned position.

3. An exposure mask according to claim 1 wherein the correlation function of the mask alignment mark with the corresponding substrate alignment mark includes a peak at an aligned position superimposed on a uniform background at the not aligned positions for a capture distance from the aligned position.

4. An exposure mask according to claim 3 wherein the capture distance is at least twice the width of the peak at the aligned position.

5. An exposure mask according to claim 1 wherein the openings are rectilinear and the mask alignment mark comprises a regularly spaced linear array of positions at which any openings forming the mask alignment mark are located, a distance between each of the regularly spaced positions and the adjacent regularly spaced position being approximately the same as the width of the narrowest opening.

6. An exposure mask according to claim 5 wherein the number of positions in the regularly spaced linear array of positions is n and the transmission ratio is (n+1)/2n.

7. An exposure mask according to claim 1 wherein the transmission ratio is within the range of 40 to 60 percent.

8. An exposure mask according to claim 1 wherein the transmission ratio is at least 50 percent.

9. An exposure mask according to claim 1 wherein the corresponding substrate alignment mark comprises at least three identical repetitions of the mask alignment mark.

10. An exposure mask according to claim 1 further including a second mask alignment mark arranged at right angles to the first mask alignment mark, the second mask alignment mark including a second plurality of openings arranged to pass the charged particle beam to the substrate, the substrate having a corresponding second substrate alignment mark and the second plurality of openings in the second mask alignment mark being arranged pseudo-randomly.

11. An exposure mask according to claim 1 further including a plurality of additional mask alignment marks, the first mask alignment mark being adapted for globally aligning the exposure mask relative to the substrate and the plurality of additional mask alignment marks being adapted for the fine alignment of individual chip patterns.

12. An exposure mask according to claim 1 wherein the mask alignment mark is arranged at the periphery of the exposure mask in such a manner that the registration takes place without the simultaneous exposure of the chip areas.

13. An exposure mask according to claim 1 wherein the mask alignment mark is positioned on the exposure mask in a location corresponding to a kerf on the substrate for cutting the substrate into individual chips after manufacture.

14. A method of aligning an exposure mask with a substrate in an electron beam projection system comprising the steps of:

providing a mask alignment mark on the exposure mask, the mask alignment mark including a plurality of openings for transmitting electrons, the openings being arranged pseudo-randomly and defining a transmission ratio;

providing a substrate alignment mark on the substrate corresponding to the mask alignment mark, the substrate alignment mark having features that directly correspond to the openings in the mask alignment mark for providing an alignment signal, the substrate alignment mark including at least one repetition of the pseudo-random mask alignment mark, and the mask alignment mark and the corresponding substrate alignment mark defining a correlation function of the mask alignment mark with the corresponding substrate alignment mark;

projecting the exposure mask onto the substrate by transmitting said electrons through the exposure mask; and aligning the exposure mask with the substrate by detecting a peak in the alignment signal when the exposure mask is aligned with the substrate such that the electrons transmitted through the openings of the mask alignment mark impinge upon the corresponding features of the substrate alignment mark.

15. A method of aligning an exposure mask according to claim 14 wherein the substrate alignment mark includes at least three repetitions of the pseudo-random mask alignment mark.

16. A method of aligning an exposure mask according to claim 14 wherein the correlation function of the mask alignment mark with the corresponding substrate alignment mark includes a peak at an aligned position having a magnitude greater than any other peak in the correlation function within a distance from the aligned position that is at least twice the width of the peak at the aligned position.

* * * * *